(12) United States Patent
Zschaeck et al.

(10) Patent No.: US 12,135,211 B2
(45) Date of Patent: Nov. 5, 2024

(54) DEVICE FOR MEASURING A SUBSTRATE AND METHOD FOR CORRECTING CYCLIC ERROR COMPONENTS OF AN INTERFEROMETER

(71) Applicant: Carl Zeiss SMT GmbH, Oberkochen (DE)

(72) Inventors: Stephan Zschaeck, Weissendorf (DE); Uwe Horn, Rudolstadt (DE); Thomas Kutzner, Cospeda (DE); Oliver Jaeckel, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 107 days.

(21) Appl. No.: 17/737,209

(22) Filed: May 5, 2022

(65) Prior Publication Data

US 2022/0260359 A1    Aug. 18, 2022

Related U.S. Application Data

(63) Continuation of application No. PCT/EP2020/081694, filed on Nov. 11, 2020.

(30) Foreign Application Priority Data

Nov. 14, 2019   (DE) .......................... 102019130696.5

(51) Int. Cl.
*G01B 9/02056* (2022.01)
*G01B 9/02015* (2022.01)
(Continued)

(52) U.S. Cl.
CPC ..... *G01B 9/02059* (2013.01); *G01B 9/02015* (2013.01); *G01B 9/0207* (2013.01);
(Continued)

(58) Field of Classification Search
CPC . G01B 9/0207; G01B 2290/60; G03F 7/7085; G03F 7/70883; G03F 7/70933
See application file for complete search history.

(56) References Cited

U.S. PATENT DOCUMENTS 5,483,343 A     1/1996  Iwamoto et al.
5,585,922 A *  12/1996  Sueyoshi ............. G01B 9/0207
                                                                356/498

(Continued)

FOREIGN PATENT DOCUMENTS

| JP | 2009-236554 | 10/2009 | ............... G01B 9/02 |
| WO | WO 03/048681 | 6/2003 | ............... G01B 9/02 |
| WO | WO 2010/082066 | 7/2010 | ............... G01B 9/02 |

OTHER PUBLICATIONS

The Office Action issued by the German Patent Office for Application No. DE 10 2019 130 696.5, dated Jul. 24, 2020 (with English Translation).

(Continued)

*Primary Examiner* — Michael A Lyons
(74) *Attorney, Agent, or Firm* — Fish & Richardson P.C.

(57) ABSTRACT

A device for measuring a substrate for semiconductor lithography with a reference interferometer for ascertaining the change in the ambient conditions, wherein the reference interferometer comprises a means for changing the optical path length of a measurement section of the reference interferometer, and a method for correcting cyclic error components in the reference interferometer using same.

13 Claims, 3 Drawing Sheets

(51) Int. Cl.
  *G01B 9/02055* (2022.01)
  *G03F 7/00* (2006.01)
(52) U.S. Cl.
  CPC ........ *G03F 7/7085* (2013.01); *G03F 7/70883* (2013.01); *G03F 7/70933* (2013.01); *G01B 2290/60* (2013.01); *G01B 2290/70* (2013.01)

(56) References Cited

U.S. PATENT DOCUMENTS

| | | | | |
|---|---|---|---|---|
| 5,596,410 | A * | 1/1997 | Hantel | G01B 9/0207 356/493 |
| 5,708,505 | A | 1/1998 | Sogard et al. | |
| 6,137,574 | A | 10/2000 | Hill | |
| 6,181,420 | B1 | 1/2001 | Badami et al. | |
| 6,542,220 | B1 * | 4/2003 | Schrijver | G03F 7/70858 355/75 |
| 6,806,961 | B2 | 10/2004 | Hill | |
| 7,616,322 | B2 | 11/2009 | Hill et al. | |
| 7,812,965 | B2 | 10/2010 | Hill | |
| 2007/0268496 | A1 * | 11/2007 | Boesser | G01B 9/02007 356/508 |
| 2009/0040530 | A1 | 2/2009 | Heiden | |
| 2010/0014097 | A1 * | 1/2010 | Sogard | G03F 7/70858 356/498 |
| 2015/0139451 | A1 * | 5/2015 | Fischer | G01D 5/266 356/519 |

OTHER PUBLICATIONS

The International Search Report and Written Opinion of the International Searching Authority for International Application No. PCT/EP2020/081694, dated Feb. 8, 2021.

The Office Action and Search Report issued by the Taiwan Patent Office for Application No. TW 109139550 dated Oct. 1, 2022 (with English Translation).

* cited by examiner

DEVICE FOR MEASURING A SUBSTRATE AND METHOD FOR CORRECTING CYCLIC ERROR COMPONENTS OF AN INTERFEROMETER

CROSS-REFERENCE TO RELATED APPLICATIONS

This application is a continuation of and claims priority under 35 U.S.C. § 120 from PCT Application No. PCT/EP2020/081694, filed on Nov. 11, 2020, which claims priority from German Application No. 10 2019 130 696.5, filed on Nov. 14, 2019. The entire contents of each of these priority applications are incorporated herein by reference.

TECHNICAL FIELD

The invention relates to a device for measuring a substrate and to a method for correcting cyclic error components of an interferometer.

BACKGROUND

Interferometers are highly accurate measuring instruments which can be used for measuring distances and can achieve accuracies of a few nanometres or less. In order to achieve these accuracies, the ambient conditions such as temperature, air humidity, pressure have to be monitored or measured very accurately in order to be able to minimize or correct the influence thereof. The change in the ambient conditions which cause a deviation in wavelength of electromagnetic radiation used in interferometers is usually determined by the use of a so-called reference interferometer. The reference interferometer comprises a measurement section having a fixed geometric length, as a result of which the change in the optical path length of the interferometer is attributable to the change in the ambient conditions. This change can be determined and used for correcting interferometers for detecting positions of objects, such as, for example, of an object stage of a device for measuring a substrate for semiconductor lithography. Besides the change in the refractive index, which can be determined according to the Edlen formula, for example, other errors that corrupt the optical path length can also occur in interferometers. With the use of heterodyne interferometers, that is to say interferometers which are operated with two different wavelengths, so-called cyclic errors occur according to the quality of the optical components. An s-polarized and a p-polarized beam portion are superimposed with the aid of polarizing beam splitters (PBS). In the actual interferometer, a further polarizing beam splitter serves for splitting the different polarization portions between the measurement and reference sections of the interferometer. Both non-perfect optical functional surfaces themselves and their combination with non-ideal beam polarization separation result in crosstalk of incorrect beam portions into the respective other beam portions and thus in cyclic errors.

The US patent specification U.S. Pat. No. 7,616,322 B2, which is fully incorporated by reference in this application, describes a method in which cyclic errors are corrected by the change in the optical path length by a change in the geometric length of the measurement section, such as is possible in the case of interferometers having movable reflectors for detecting positions, by use of an algorithm. Said change in the optical path length is not possible in the case of a reference interferometer on account of the fixed path length of the interferometer.

SUMMARY

It is an aspect of the present invention to provide a device which resolves the above-described disadvantages of the prior art. A further aspect of the invention is to specify an improved method for correcting cyclic errors.

This aspect is achieved by use of a device and a method having the features of the independent claims. The dependent claims relate to advantageous developments and variants of the invention.

A device according to an aspect of the invention for measuring a substrate for semiconductor lithography comprises a reference interferometer for ascertaining the change in the ambient conditions, wherein the reference interferometer comprises a means for changing the optical path length of a measurement section of the reference interferometer, wherein the means is configured to bring about a change in the refractive index. The substrates that are measured by the device can be photomasks or wafers, for example. The reference interferometer can be embodied for example as a homogeneous or heterodyne Fabry-Perot interferometer or Michelson interferometer.

Furthermore, in some implementations, the means can be configured to bring about the change in the refractive index by a change in the pressure and/or the moisture and/or the temperature of a purge gas in the reference interferometer. In this context, purge gas is understood to mean the gas or gas mixture which is situated in the optical path, that is to say through which the light of the interferometer is transmitted. The purge gas is usually exchanged continuously in order to minimize heating of the interferometer or of the reference interferometer and gas vortices brought about by thermal effects in the optical path. The purge gas can for example be air, but also comprise other purge gases such as helium, hydrogen, nitrogen, carbon dioxide, sulfur hexafluoride or neon.

In addition, in some examples, the means can be configured to bring about the change in the refractive index by a change in the composition of the purge gas in the reference interferometer.

In particular, the means can comprise a purge device. On account of the dependence of the refractive index of gases on pressure, temperature and relative humidity, devices for measuring a substrate for semiconductor lithography usually comprise a purge device. The latter can be modified such that besides the purge gas normally used, such as air, for example, a second purge gas from the above-described group of gases can also be used in order that at least the reference interferometer can thereby be purged. As a result, it is possible to alter the refractive index with constant pressure in the reference interferometer and thus to alter the optical path length of the interferometer.

Furthermore, in some implementations, the reference interferometer can be configured to bring about the change in the optical path length by the movement of a mirror of the reference interferometer. In particular, an actuator for moving the mirror can be present, which actuator can be embodied as a piezoactuator. In this case, besides the actuator, at least one sensor can also be arranged at a mirror, for example, whereby the mirror can be kept at a position during operation and the mirror, in order to determine the cyclic errors, can be moved in the direction of the geometric path length of the reference interferometer, as a result of which a change in the optical path length can be brought about.

In addition, in some examples, an open-loop control and/or a closed-loop control for manual open-loop control and/or closed-loop control of the means can be present. Said controller can open-loop control or closed-loop control firstly the state of the purge gas and/or the composition thereof or the position of the mirror by way of the actuator, wherein the open-loop control and/or closed-loop control can be manually open-loop and/or closed-loop controlled.

Furthermore, in some examples, an open-loop control and/or a closed-loop control for electronic open-loop control and/or closed-loop control of the means can be present. In this case, the change in the geometric path length and/or the change in the refractive index can be electronically open-loop or closed-loop controlled by a predetermined program, without a manual intervention being necessary. During the movement of the mirror or the change in the optical path length by the change in the refractive index, the path length of the reference interferometer can be continuously detected and stored for a later evaluation in the open-loop control and/or closed-loop control.

A method according to an aspect of the invention for correcting cyclic error components of a reference interferometer, wherein the reference interferometer comprises a means for changing the optical path length of a measurement section of the reference interferometer, comprises the following method steps:
  starting up the reference interferometer,
  continuously detecting measurement values of the reference interferometer,
  changing the optical path length of the measurement section of the reference interferometer until a path length change of at least one quarter of the wavelength of the reference interferometer is detected,
  determining the cyclic errors on the basis of the continuously detected measurement values of the reference interferometer, and
  correcting the measurement values ascertained by the reference interferometer on the basis of the cyclic errors ascertained.

In this context, starting up the reference interferometer should be understood to mean switching on the reference interferometer and attaining an operating state. Continuously detecting measurement values relates predominantly to the measured current wavelength of the measurement radiation under the instantaneous ambient conditions. In this context, continuously means in predetermined regular time intervals that can be in a range of 0.1 kHz to 10 kHz. The cyclic errors can be determined from the data thus ascertained for example with the aid of a method described in the US patent specification U.S. Pat. No. 7,616,322 B2. Once the errors have been determined, the measurement value ascertained by the reference interferometer can be corrected on the basis of the errors ascertained.

In addition, in some examples, the change in the optical path length can be brought about by the change in the pressure and/or the moisture and/or the temperature of the purge gas situated in the reference interferometer. On account of the known dependence on the ambient conditions, interferometers are usually operated in environmental chambers, wherein the ambient conditions can be controlled by a purge device connected to the environmental chamber. Temperature and moisture of the purge gas can be controlled well in this way, wherein the pressure fluctuations governed by the weather make it difficult to carry out control of pressure, especially over a relatively long period of time, for which reason this can be ascertained by the reference interferometer and used for the correction of the interferometer for detecting the position of the object stage or the optical imaging of the registration measuring instrument.

In particular, in some examples, the change in the optical path length of the reference interferometer can be brought about by a change in the composition of the purge gas in the reference interferometer. The purge device can be used in this case, too, wherein besides the purge gas usually used during operation, such as air, for example, a second purge gas can be admixed with the air or the air at least in the reference interferometer can be completely exchanged for a different gas having a different refractive index.

In this case, the composition of the purge gas in the reference interferometer during normal operation of the device can correspond to the composition of the purge gas of an interferometer for detecting the position of an object stage and/or of an imaging optical unit of the device. This ensures that the ambient influences ascertained by the reference interferometer correspond to those in the interferometer for detecting the position of an object stage and/or an imaging optical unit of the device and the correction values of the detected geometric path length that are determined from the ambient influences can be used for correcting the interferometer.

In particular, in some examples, the composition of the purge gas can comprise one or more of the following gases: air, helium, hydrogen, nitrogen, carbon dioxide, sulfur hexafluoride or neon. Helium is preferably used since it is present for other tasks in the device for measuring substrates for semiconductor lithography and, as a result, no new infrastructure needs to be embodied in the devices.

Furthermore, in some implementations, the optical path length can be brought about by displacing a mirror of the reference interferometer. Said mirror can be displaced in the direction of the geometric path length of the interferometer for example by a piezoactuator or any other suitable actuator. For the open-loop control and/or the closed-loop control of the movement, the position of the mirror can also be detected by a sensor. As a result, the travel during the movement of the mirror can be detected or the mirror can be closed-loop controlled to a fixed position during operation.

In particular, the optical path length change can amount to at least one quarter of the wavelength of the reference interferometer, in particular to said wavelength, in particular to double said wavelength. An optical path length change of one quarter of the wavelength is at least necessary in order that the algorithm disclosed in the U.S. Pat. No. 7,616,322 B2 can be applied. In the case of a path length change by double the wavelength, the correction values ascertained by the algorithm are sufficiently accurate.

Furthermore, the reference interferometer corrected on the basis of the cyclic errors ascertained can be used for determining changes in ambient conditions for the correction of an interferometer for detecting the position of an object stage and/or of an imaging optical unit of the device. As a result, besides the errors in the position determination or the optical imaging as a result of a change in the ambient conditions of the purge gas used during operation, the cyclic errors of the interferometer are also corrected. Following from this, the errors during the detection of the position of the object stage and thus of the object can advantageously be reduced further. The imaging aberration of the imaging optical unit of the device for measuring substrates can likewise be reduced further as a result.

BRIEF DESCRIPTION OF DRAWINGS

Exemplary embodiments and variants of the invention are explained in more detail below with reference to the drawings. In the figures.

DETAILED DESCRIPTION

Figure 1:
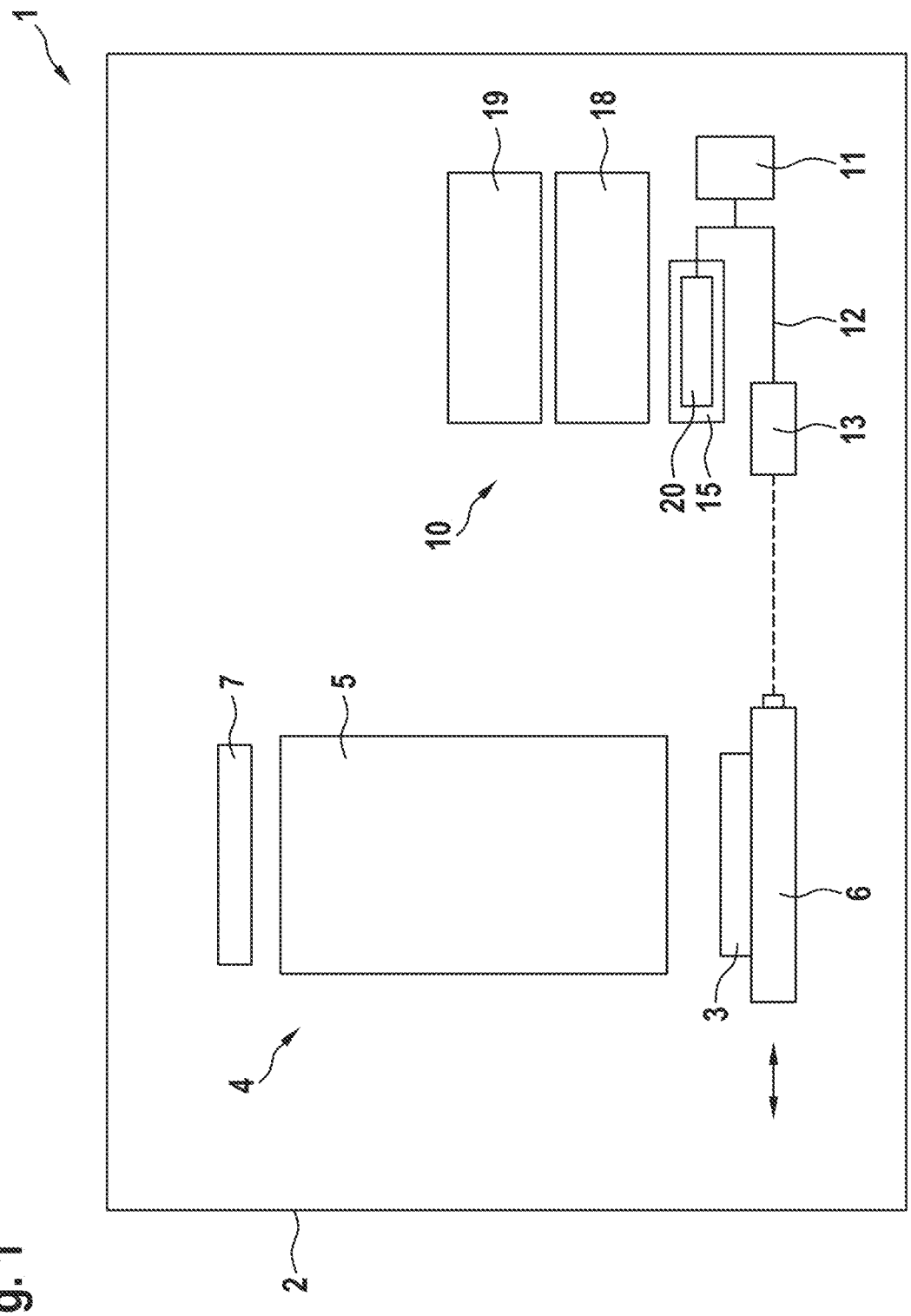
FIG. 1 shows a basic illustration of a registration tool in which the invention is realized.

FIG. 1 shows a basic illustration of a registration measuring instrument 1 for photomasks for semiconductor lithography, illustrating an enclosure 2 with an imaging device 4 and a measuring device 10. The imaging device 4 comprises an image capturing device 7, an imaging optical unit 5 and an object stage 6. The object 3, which can be embodied as a photomask or a wafer for semiconductor lithography, is illuminated by an illumination device (not illustrated) either in a reflected light method or in a transmitted light method and is imaged onto the image capturing device 7 by the imaging optical unit 5. Said image capturing device 7 comprises a camera (not illustrated) that captures the image of the object 3. The object 3 is arranged on an object stage 6, which can move the object 3 relative to the imaging optical unit 5, whereby structures at different locations on the object 3 are imaged onto the image capturing device 7. The position of the object stage 6 is detected by an interferometer 13 in the range of a few nanometres, such that the position of the structure on the object 3 can be deduced therefrom. The interferometer 13 is part of a measuring device 10 which, besides the interferometer 13, also comprises a reference interferometer 20, a purge device 18, a purge chamber 15, a light source 11 and an open-loop control 19. The light source 11 generates light having a wavelength, which light is guided via optical waveguides 12 to the interferometer 13 and the reference interferometer 20. The interferometers 13, 20 are operated as heterodyne interferometers, that is to say with light having different wavelengths. The reference interferometer 20 ascertains the change in the wavelength on account of the change in ambient conditions, as a result of which the position ascertained by the interferometer 13 can be corrected. The ambient conditions in the enclosure 2 and in the purge chamber 15 of the reference interferometer 20 are identical during operation of the registration measuring instrument 1, air being used as purge gas. The purge gas is conditioned by the purge device 18 and introduced into the enclosure 2 and the purge chamber 15. The ambient conditions in the enclosure 2 and in the purge chamber 15 change equally as a result during normal operation of the device, as a result of which the changes in the reference interferometer 20 which are attributable to the alteration of the optical path length can be used as correction for the detected path length of the interferometer 13.

Figure 2:
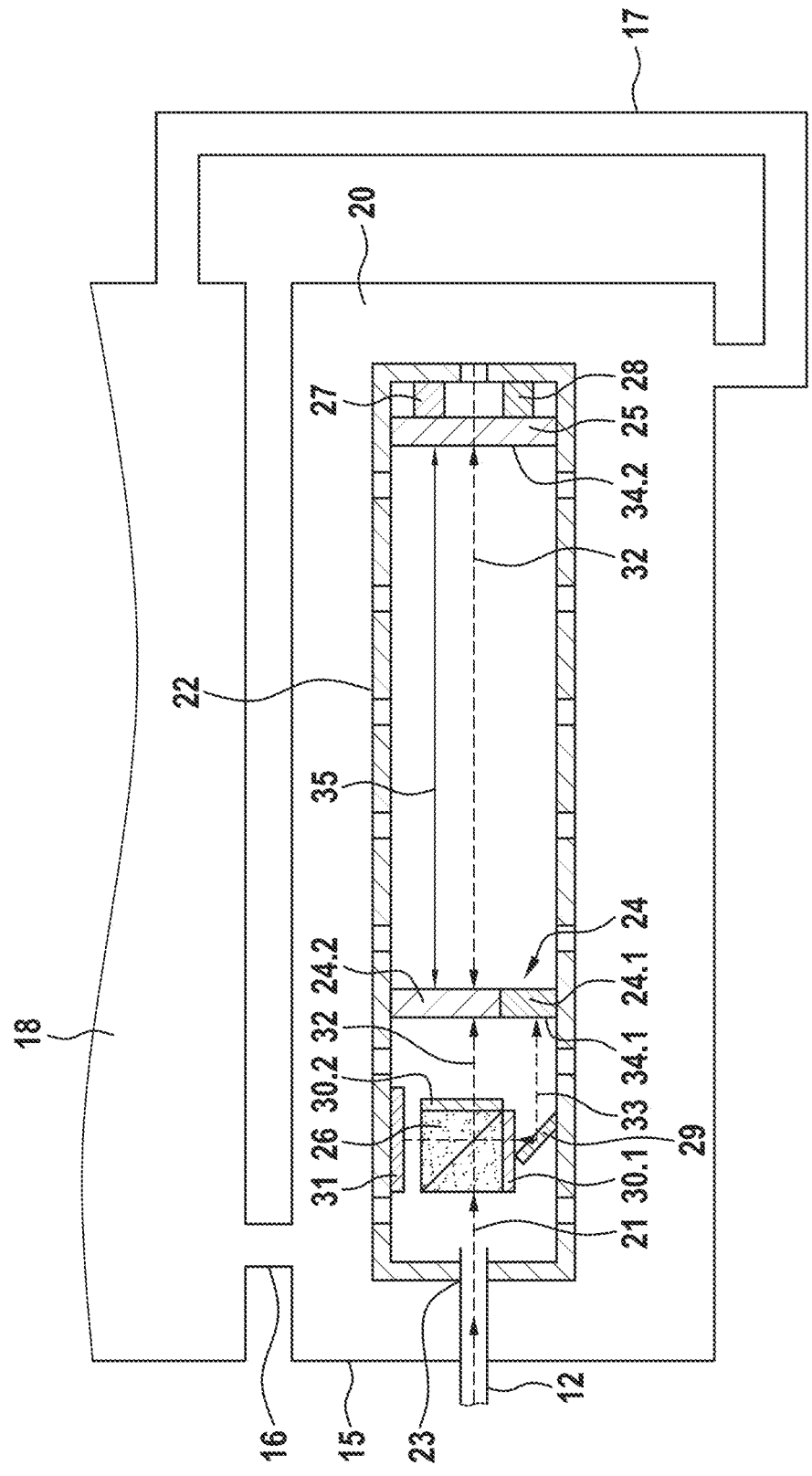
FIG. 2 shows a detailed view of the invention.

FIG. 2 shows a detail of the invention illustrating the reference interferometer 20, the purge chamber 15 and the feed 16 and the return 17 to the purge device 18. The purge gas is fed to the purge chamber 15 by the feed 16 and returned by the return 17 to the purge device 18 again, where said purge gas is conditioned and fed to the purge chamber 15 again. The reference interferometer 20 is embodied as a Fabry-Perot interferometer comprising an input coupling 23, a polarizing beam splitter 26, a first mirror 24, a second mirror 25 and a housing 22. The light 21 emitted by the light source (not illustrated) is guided via an optical waveguide 12 to the housing 22 and is coupled into the housing 22 of the reference interferometer 20 at the input coupling 23. The polarizing beam splitter 26 splits the light 21 into a measurement beam 32 and a reference beam 33. The reference beam 33 is deflected by 90° in the beam splitter 26 and, downstream of the beam splitter 26, passes through a λ/4 plate 30.1 in order subsequently to be deflected by a further 90° at a deflection mirror 29, such that the reference beam 33 once again runs parallel to the measurement beam 32. The reference beam 33 is reflected back on itself at the first mirror 24 at a highly reflective coating 34.1 arranged in the lower region of the mirror 24.1. Downstream of the beam splitter 26, the measurement beam 32 likewise passes firstly through a λ/4 plate 30.2 and then through the first mirror 24, which has no reflective coating in its upper region 24.2. The measurement beam 32, in its further course, is likewise reflected at a second mirror 25 having a highly reflective coating 34.2. The distance between the first mirror 24 and the second mirror 25 is the measurement section 35, with the aid of which the alterations of the ambient conditions are determined. The reflected reference beam 33 and the reflected measurement beam 32 return on the same path after reflection, are recombined in the polarizing beam splitter 26 and are fed to a detector 31 for evaluation. In the purge chamber 15, the temperature, the moisture and optionally the pressure of the purge gas, which comprises air during operation, that is to say when the registration measuring instrument measures substrates, can be closed-loop controlled in a comparatively simple manner. For the case where the cyclic errors of the reference interferometer 20 are intended to be determined, the optical path length in the reference interferometer 20 is altered. This is brought about either by the change in the pressure, the moisture or the temperature of the purge gas or by a change in the composition of the purge gas. The purge device 18 is embodied such that besides air as purge gas it can also feed helium or some other gas as purge gas to the purge chamber 15. As a result of the refractive index of helium deviating from that of air, the optical path length in the reference interferometer 20 is altered. The path length change is detected continuously during the change in the refractive index and the cyclic errors are determined on the basis of the detected data. Besides the change in the purge gas, the optical path length of the reference interferometer can also be brought about by the movement of one of the two mirrors 24, 25. For this purpose, an actuator 27 and a sensor 28 are arranged at the second mirror 25, whereby the second mirror 25 can be positioned in a controlled manner. The position of the mirror 25 is kept constant during the operation of the registration measuring instrument. During the determination of the cyclic errors, the mirror 25 is moved along the geometric length of the reference interferometer 20 by the actuator and in the process shortens or lengthens the geometric and thus the optical path length of the resonator and thus of the reference interferometer 20. Besides the arrangement in which the reference interferometer 20 is surrounded by a purge chamber 15 as shown in FIG. 1 and FIG. 2, an arrangement in which the reference interferometer 20 does not comprise a dedicated purge chamber 15 is also conceivable. In this case, the purge device 18 closed-loop controls the ambient conditions in the entire enclosure 2. This solution is suitable in particular for retrofitting registration measuring machines 1, since the existing infrastructure can be used.

Figure 3:
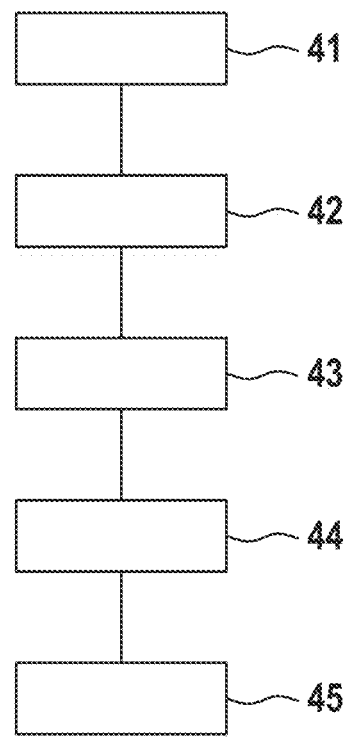
FIG. 3 shows a flow diagram concerning a method according to the invention.

FIG. 3 describes one possible method for correcting cyclic error components of a reference interferometer 20, wherein the reference interferometer 20 comprises a means 18, 27 for changing the optical path length of a measurement section of the reference interferometer 20.

In a first method step 41, the reference interferometer 20 is started up.

In a second method step 42, the measurement values of the reference interferometer 20 are continuously detected.

In a third method step 43, the optical path length of the measurement section of the reference interferometer 20 is altered until a path length change of at least one quarter of the wavelength of the reference interferometer 20 is detected.

In a fourth method step 44, the cyclic error is determined on the basis of the continuously detected measurement values of the reference interferometer 20.

In a fifth method step 45, the measurement values ascertained by the reference interferometer are corrected on the basis of the cyclic errors ascertained.

LIST OF REFERENCE SIGNS

1 Registration measuring instrument, device
2 Enclosure
3 Object
4 Imaging device
5 Imaging optical unit
6 Object stage
7 Image capturing device
10 Measuring device
11 Light source
12 Optical waveguide
13 Interferometer
14 Wave normal
15 Purge chamber
16 Feed
17 Return
18 Purge device
19 Open-loop control/closed-loop control
20 Reference interferometer
21 Light
22 Housing
23 Input coupling
24, 24.1, 24.2 First mirror
25 Second mirror
26 Polarizing beam splitter
27 Actuator
28 Sensor
29 Deflection mirror
30.1, 30.2 λ/4 plate
31 Detector
32 Measurement beam
33 Reference beam
34.1, 34.2 Coating
35 Measurement section
41 Method step 1
42 Method step 2
43 Method step 3
44 Method step 4
45 Method step 5

What is claimed is:

1. A device for measuring a substrate for semiconductor lithography with a measurement interferometer for measuring a position of the substrate, wherein the device comprises a reference interferometer for ascertaining a change in ambient conditions within an enclosure containing the substrate to correct the position measured by the measurement interferometer,
wherein the reference interferometer comprises a means for changing the optical path length of a measurement section of the reference interferometer.

2. The device of claim 1,
wherein the means is configured to bring about the change in the optical path length by a change in the pressure and/or the moisture and/or the temperature of a purge gas in the reference interferometer to cause a change in the refractive index of the measurement section.

3. The device of claim 2, wherein the means in the reference interferometer further comprises a movable mirror and is configured to bring about a further change in the optical path length by the movement of the movable mirror.

4. The device of claim 1,
wherein the means is configured to bring about the change in the optical path length by a change in the composition of a purge gas in the reference interferometer to cause a change in the refractive index of the measurement section.

5. The device of claim 4, wherein the means in the reference interferometer further comprises a movable mirror and is configured to bring about a further change in the optical path length by the movement of the movable mirror.

6. The device of claim 1,
wherein the means comprises a purge device.

7. The device of claim 1,
wherein the means in the reference interferometer comprises a movable mirror and is configured to bring about the change in the optical path length by the movement of the movable mirror.

8. The device of claim 7,
comprising an actuator for moving the mirror.

9. The device of claim 8,
wherein the actuator is embodied as a piezoactuator.

10. The device of claim 1,
wherein an open-loop control and/or a closed-loop control for manual open-loop control and/or closed-loop control of the means are/is present.

11. The device of claim 1,
wherein an open-loop control and/or a closed-loop control for electronic open-loop control and/or closed-loop control of the means are/is present.

12. The device of claim 1, wherein the optical path length of the measurement section of the reference interferometer is independent of the position of the substrate.

13. The device of claim 12, wherein the reference interferometer comprises a housing that contains the optical path length of the measurement section of the reference interferometer and wherein the enclosure containing the substrate is in fluid communication with housing of the reference interferometer.

* * * * *